United States Patent
Kojima et al.

(10) Patent No.: US 11,956,004 B2
(45) Date of Patent: Apr. 9, 2024

(54) TERMINAL APPARATUS

(71) Applicant: YOKOGAWA ELECTRIC CORPORATION, Tokyo (JP)

(72) Inventors: Osamu Kojima, Musashino (JP); Jun Naraoka, Musashino (JP)

(73) Assignee: Yokogawa Electric Corporation, Tokyo (JP)

( * ) Notice: Subject to any disclaimer, the term of this patent is extended or adjusted under 35 U.S.C. 154(b) by 0 days.

(21) Appl. No.: 17/903,668

(22) Filed: Sep. 6, 2022

(65) Prior Publication Data
US 2023/0088103 A1 Mar. 23, 2023

(30) Foreign Application Priority Data
Sep. 17, 2021 (JP) ................. 2021-152576

(51) Int. Cl.
*G06F 1/30* (2006.01)
*G01R 19/165* (2006.01)
*G06F 1/26* (2006.01)
*H04B 1/40* (2015.01)

(52) U.S. Cl.
CPC ......... *H04B 1/40* (2013.01); *G01R 19/16552* (2013.01); *G06F 1/266* (2013.01); *G06F 1/305* (2013.01)

(58) Field of Classification Search
CPC ....................................................... G06F 1/30
See application file for complete search history.

(56) References Cited

U.S. PATENT DOCUMENTS

| 7,092,613 B1* | 8/2006 | Ide | G11B 19/04 386/277 |
| 2007/0085675 A1* | 4/2007 | Darshan | H04L 12/10 307/3 |
| 2015/0103179 A1* | 4/2015 | Galvin | H04N 21/274 348/159 |
| 2020/0235607 A1* | 7/2020 | Kanarellis | H02J 9/061 |
| 2022/0229482 A1* | 7/2022 | Ba | G06F 1/3221 |

FOREIGN PATENT DOCUMENTS

| JP | 2006155372 A | 6/2006 |
| JP | 2009253307 A | 10/2009 |
| JP | 2011039685 A | 2/2011 |
| JP | 2011065480 A | 3/2011 |
| JP | 2013148943 A | 8/2013 |
| JP | 2020053768 A | 4/2020 |
| JP | 2020088719 A | 6/2020 |

* cited by examiner

*Primary Examiner* — Mark A Connolly
(74) *Attorney, Agent, or Firm* — Osha Bergman Watanabe & Burton LLP

(57) ABSTRACT

A terminal apparatus includes: a communication interface that acquires data output from a data output apparatus and supplies power to the data output apparatus; a storage that writes the data to a medium; a controller that controls the storage; a power supply that supplies power to the storage; and a power receiver that receives power from an external power source and supplies power to the communication interface and the power supply. In response to detecting a power outage and/or a voltage drop of the external power source, the controller controls the communication interface to stop supplying power to the data output apparatus.

5 Claims, 2 Drawing Sheets

TERMINAL APPARATUS

CROSS-REFERENCE TO RELATED APPLICATION

The present application claims priority to Japanese Patent Application No. 2021-152576 filed on Sep. 17, 2021, the entire contents of which are incorporated herein by reference.

BACKGROUND

Technical Field

The present disclosure relates to a terminal apparatus.

Description of Related Art

A gateway device for acquiring image data from an image sensor is known. See, for example, Patent Literature (PTL) 1.

PATENT LITERATURE

PTL 1: JP 2020-53768 A

SUMMARY

A terminal apparatus according to one or more embodiments includes a communication interface configured to acquire data outputted from a data output apparatus and supply power to the data output apparatus; a storage configured to write the data to a medium; a controller configured to control the storage; a power supply configured to supply power to the storage; and a power receiver configured to receive power from an external power source and supply power to the communication interface and the power supply. In a case in which a power outage and/or a voltage drop of the external power source is detected, the controller is configured to control the communication interface to stop supplying power to the data output apparatus.

DETAILED DESCRIPTION

Figure 1:
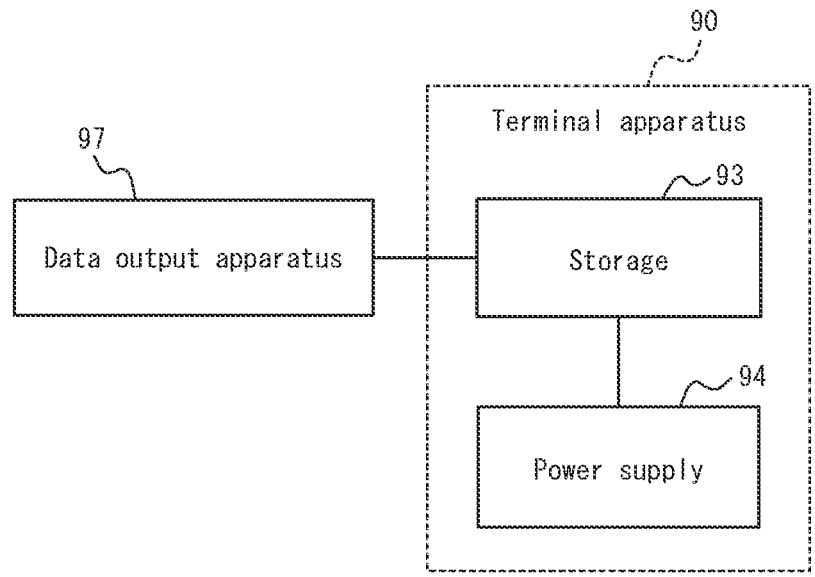
FIG. 1 is a circuit diagram of a terminal apparatus according to a comparative example.

In gateway devices, there is a need to improve the reliability of functions for storing various types of data, not only image data. It would be helpful to provide a terminal apparatus that can improve the reliability of a data storage function.

A terminal apparatus according to several embodiments includes a communication interface configured to acquire data outputted from a data output apparatus and supply power to the data output apparatus; a storage configured to write the data to a medium; a controller configured to control the storage; a power supply configured to supply power to the storage; and a power receiver configured to receive power from an external power source and supply power to the communication interface and the power supply. In a case in which a power outage and/or a voltage drop of the external power source is detected, the controller is configured to control the communication interface to stop supplying power to the data output apparatus. This configuration lengthens the time during which the supply of power to the storage can be continued. The continuous supply of power to the storage facilitates completion of the writing of data to the storage. Consequently, the reliability of data storage by the terminal apparatus improves.

In a terminal apparatus according to one or more embodiments, in a case in which a power outage and/or a voltage drop of the external power source is detected, the controller may be configured to stop supply of power to the communication interface. As compared to the case of not stopping the supply of power to the communication interface, this configuration further lengthens the time during which the supply of power to the storage can be continued. The continuous supply of power to the storage facilitates completion of the writing of data to the storage. Consequently, the reliability of data storage by the terminal apparatus improves.

In a terminal apparatus according to one or more embodiments, in a case in which a power outage and/or a voltage drop of the external power source is detected, the controller may be configured to determine an end point of data outputted from the data output apparatus as streaming data. This configuration clarifies the conditions for completing the writing of data. Consequently, completion of the writing of data is facilitated.

In a terminal apparatus according to one or more embodiments, the controller may be configured to determine the end point of the data by stopping acquisition of the data. This configuration clarifies the conditions for completing the writing of data. Consequently, completion of the writing of data is facilitated.

In a terminal apparatus according to one or more embodiments, the controller may be configured to determine the end point of the data by controlling the data output apparatus to stop outputting the data. This configuration clarifies the conditions for completing the writing of data. Consequently, completion of the writing of data is facilitated.

According to the present disclosure, a terminal apparatus that can improve the reliability of a data storage function is provided.

Embodiments of the present disclosure are described while being compared to a comparative example.

Comparative Example

As illustrated in FIG. 1, a terminal apparatus 90 according to a comparative example includes a storage 93 and a power supply 94. The storage 93 acquires and stores data outputted by a data output apparatus 97. The storage 93 operates on electric power supplied by the power supply 94. When the power supply 94 becomes unable to supply power, the storage 93 stops operating.

The storage 93 writes the data acquired from the data output apparatus 97 to a medium. The storage 93 writes the data to a medium such as a magnetic disk or flash memory, for example. In a case in which the power supply from the power supply 94 stops while the storage 93 is performing the operation of writing data to the medium, the probability increases that the writing of data will not be completed. In a case in which the writing stops before the data writing is completed, the data is lost. Consequently, the reliability of the data storage function in the terminal apparatus 90 is reduced. The probability of the storage 93 failing also increases. In a case in which the storage 93 fails, the storage 93 will be unable to resume writing of data even if the power supply from the power supply 94 resumes. Consequently, the reliability of the data storage function in the terminal apparatus 90 is reduced.

In a case in which the terminal apparatus 90 is used in an edge computer gateway application, it is difficult to recover lost data. It is also difficult to repair a failed terminal apparatus 90 and resume the writing of data. Consequently, the reliability of the data storage function in the terminal apparatus 90 is reduced.

As described above, the terminal apparatus 90 according to the comparative example is problematic in terms of reliability of the data storage function.

A terminal apparatus 10 (see FIG. 2) that can improve the reliability of the data storage function is therefore described in the present disclosure. The terminal apparatus 10 may be used in edge computer gateway applications. The terminal apparatus 10 may be used as a gateway terminal for the Internet of Things (IoT). The terminal apparatus 10 may be applied to a cloud computing system.

EXAMPLES

Figure 2:
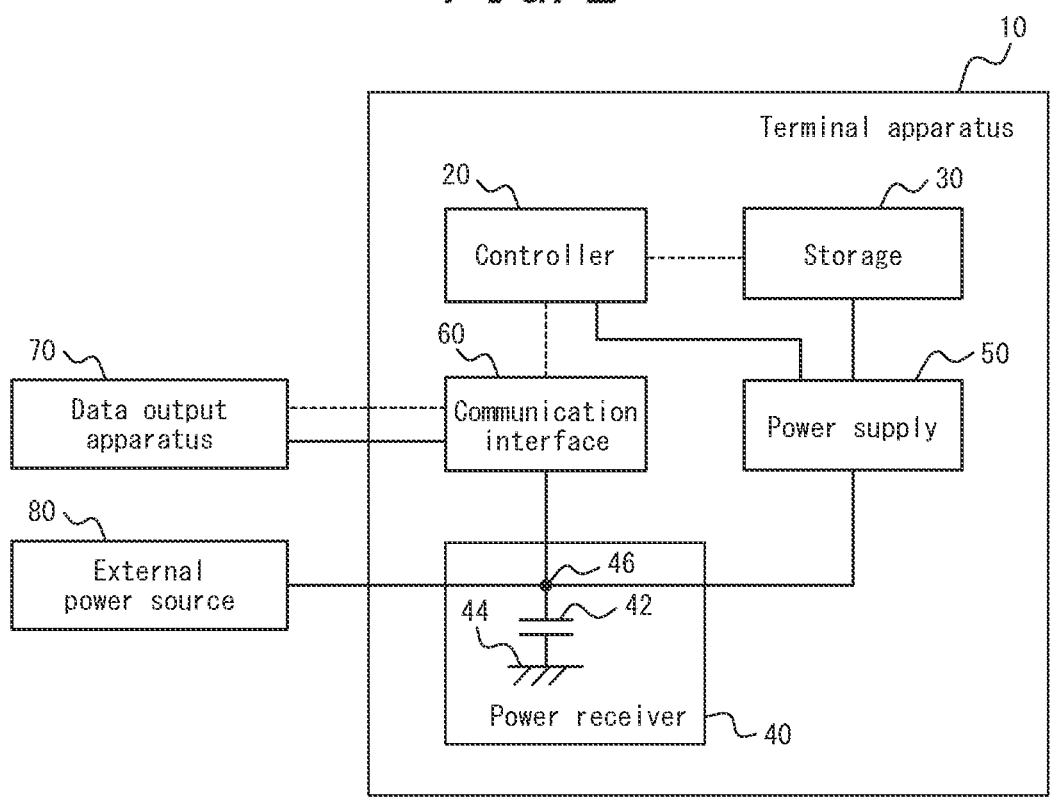
FIG. 2 is a block diagram illustrating an example configuration of a terminal apparatus according to one or more embodiments.

As illustrated in FIG. 2, a terminal apparatus 10 according to one or more embodiments of the present disclosure includes a controller 20, a storage 30, a power receiver 40, a power supply 50, and a communication interface 60. The solid lines connecting components represent power lines for supplying power. The dashed lines connecting components represent communication lines for transmitting and receiving signals such as data. The power receiver 40 is supplied with power from an external power source 80. The communication interface 60 acquires data from a data output apparatus 70. The terminal apparatus 10 operates on power supplied from the external power source 80 and stores the data acquired from the data output apparatus 70 in the storage 30.

(Example Configuration of Terminal Apparatus 10)

An example of each configuration of the terminal apparatus 10 is described below.

<Controller 20>

The controller 20 outputs, to the storage 30, the data acquired from the data output apparatus 70 via the communication interface 60 and controls the storage 30 to write the data. The controller 20 also controls the supply of power from the communication interface 60 to the data output apparatus 70. The controller 20 may control the supply of power to the communication interface 60. The controller 20 may control the supply of power to at least one of the components of the terminal apparatus 10. The controller 20 may control the data output apparatus 70 to start and stop outputting data.

The controller 20 may, for example, be configured by a processor such as a central processing unit (CPU). The controller 20 may implement predetermined functions by having the processor execute a predetermined program. The controller 20 may include a memory. The memory may store various information used for operations of the controller 20, programs for implementing the functions of the controller 20, and the like. The memory may function as a working memory of the controller 20. The memory may, for example, be a semiconductor memory. The memory may be configured to include volatile memory or non-volatile memory. The memory may be included in the controller 20 or may be configured as a separate entity from the controller 20.

<Storage 30>

The storage 30 stores the data acquired from the controller 20. The storage 30 may be configured as an SSD (Solid State Drive), an HDD (Hard Disk Drive), or the like. The storage 30 can store data by writing data to a medium such as a magnetic disk, flash memory, USB (Universal Serial Bus) memory, or SD card. The data stored in the storage 30 can be used by being outputted to an external device through communication via a network or the like. The data stored in the storage 30 may be used by a user removing the medium.

<Communication Interface 60>

The communication interface 60 transmits and receives data to and from the data output apparatus 70. The communication interface 60 acquires data from the data output apparatus 70 and outputs the data to the controller 20. The communication interface 60 may acquire a control signal from the controller 20 and output the control signal to the data output apparatus 70. The communication interface 60 also supplies power to the data output apparatus 70. In other words, the data output apparatus 70 operates on the power supplied from the communication interface 60. In FIG. 2, the communication interface 60 and the data output apparatus 70 are connected both by a solid line representing a power line and a dashed line representing a communication line. In other words, the communication interface 60 transmits and receives data to and from the data output apparatus 70 and supplies power to the data output apparatus 70.

The communication interface 60 may be configured to include a communication device that can transmit and receive data to and from the data output apparatus 70 and supply power to the data output apparatus 70. In one or more embodiments, the communication device is configured to be able to transmit and receive data and supply power based on technology called PoE (Power over Ethernet). According to PoE technology, the communication device can supply power to the data output apparatus 70 while transmitting and receiving data to and from the data output apparatus 70 through a LAN (Local Area Network) cable. The communication device may be configured to include a power supply circuit, such as a regulator, that controls the voltage or current of the power supplied from the power receiver 40 and outputs the power through the LAN cable.

The communication device may, for example, include a communication module compliant with mobile communication standards such as Long Term Evolution (LTE), 4th Generation (4G), or 5th Generation (5G), but these examples are not limiting. The communication device may, for example, include a communication module that transmits and receives data based on the RS-232C standard. The communication interface 60 may be equipped with ports configured to input and output digital signals.

The communication interface 60 operates on power supplied from the power receiver 40. The communication interface 60 may operate on power supplied from the power supply 50.

<Power Supply 50>

The power supply 50 supplies power to the controller 20 and the storage 30. In other words, the controller 20 and the storage 30 operate on power supplied from the power supply 50. The power supply 50 may be configured to include a power supply circuit, such as a regulator, that controls the voltage or current of the power supplied from the power receiver 40 and outputs the power.

<Power Receiver 40>

The power receiver 40 receives a supply of power from the external power source 80. The power receiver 40 supplies the supplied power to the power supply 50 and the communication interface 60. The power receiver 40 may be configured to include a smoothing circuit, a filter circuit, or the like. The power receiver 40 may be configured to include a power supply circuit, such as a regulator, that controls the voltage or current of the power and outputs the power.

The power receiver 40 can be represented by a configuration including an equivalent circuit provided with a capacitor 42 connected to a ground point 44, as illustrated in FIG. 2. The power receiver 40 buffers the power supplied from the external power source 80 with the capacitor 42 and supplies the power to the power supply 50 and the communication interface 60 through the power lines that branch at the node 46. While power is supplied from the external power source 80 to the power receiver 40, an electric charge is stored in the capacitor 42. The power supply circuit of the power supply 50 or the communication interface 60 can be configured to include an equivalent circuit similar to that of the power receiver 40. In other words, the power supply 50 or the communication interface 60 can, like the power receiver 40, include a configuration like the capacitor 42 that stores an electric charge.

<Other Configurations of Terminal Apparatus 10>

The terminal apparatus 10 may include a device that acquires positional information by use of a satellite positioning system such as GPS (Global Positioning System). The terminal apparatus 10 may include a USB (Universal Serial Bus) port. The terminal apparatus 10 may include a light emitting device such as a Light Emitting Diode (LED). The terminal apparatus 10 may include push switches or dip switches as input devices.

<Data Output Apparatus 70>

The data output apparatus 70 may, for example, be configured to include a camera such as a surveillance camera. In a case of being configured to include a camera, the data output apparatus 70 outputs image data. The data output apparatus 70 may, for example, be configured to include a sensor, such as a temperature sensor. In a case of being configured to include a sensor, the data output apparatus 70 outputs measurement data of the sensor. The controller 20 of the terminal apparatus 10 uses the communication interface 60 to acquire various types of data, such as image data or measurement data, outputted from the data output apparatus 70 and stores the data in the storage 30. In a case in which the data output apparatus 70 outputs image data, the terminal apparatus 10 stores the image data in the storage 30. The terminal apparatus 10 can, in this case, be considered a video recorder. In a case in which the data output apparatus 70 outputs measurement data, the terminal apparatus 10 stores the measurement data in the storage 30. In this case, the terminal apparatus 10 can be considered a data logger. The data output apparatus 70 may operate on power supplied from the communication interface 60 or on power supplied from another power supply, such as the external power source 80.

<External Power Source 80>

The external power source 80 may, for example, be a commercial power source supplied by the power grid, or the external power source 80 may be a battery or the like. These examples are not limiting, and the external power source 80 may be configured to include a variety of power sources.

(Example Operations of Terminal Apparatus 10)

An example of operations of the terminal apparatus 10 is described below.

The data output apparatus 70 outputs data to the communication interface 60. The communication interface 60 outputs the data acquired from the data output apparatus 70 to the controller 20. The controller 20 outputs the data acquired from the communication interface 60 to the storage 30 and controls the storage 30 to store the data. The controller 20 may temporarily store (cache) the data acquired from the communication interface 60 in a memory, read the data from the memory, and output the data to the storage 30. The storage 30 stores data by writing the acquired data to a medium. In a case of not acquiring data, the storage 30 does not write data to the medium.

In a case in which the supply of power from the external power source 80 to the power receiver 40 stops, or the voltage inputted from the external power source 80 to the power receiver 40 drops, the power receiver 40 becomes unable to supply sufficient power to the power supply 50 and the communication interface 60. The cessation of power supply from the external power source 80 to the power receiver 40 for a predetermined time or longer is also referred to as a power outage of the external power source 80. A drop, to a predetermined value or less, in the voltage inputted from the external power source 80 to the power receiver 40 is also referred to as a voltage drop of the external power source 80.

In a case in which sufficient power is not supplied to the power supply 50 from the power receiver 40, the power supply 50 becomes unable to supply the necessary power to the controller 20 and the storage 30 for the controller to output data to the storage 30 and for the storage 30 to write data to the medium. In a case in which the power supply from the power supply 50 to the controller 20 and the storage 30 stops, or the output voltage of the voltage supplied from the power supply 50 to the controller 20 and the storage 30 drops, the controller 20 becomes unable to output data to the storage 30. The storage also becomes unable to write data. Furthermore, in a case in which the memory of the controller 20 is a volatile memory, the data temporarily stored in the memory by the controller 20 may be lost.

In a case in which the controller 20 becomes unable to output data in the middle of outputting data to the storage 30, the data temporarily stored (cached) in the memory by the controller 20 may be lost. Furthermore, in a case in which the storage 30 becomes unable to write data in the middle of writing data to the medium, the data that has not yet been written may be lost. The medium may also fail. In a case in which the medium fails, the data written to the medium may become unreadable. In a case in which the medium is a memory such as flash memory, the memory cells may fail. In a case in which the medium is a magnetic disk, the magnetic head or magnetic recording surface may fail.

Even in a case in which a power outage or voltage drop of the external power source 80 occurs, the electric charge stored in the capacitor 42, represented as an equivalent circuit in the power receiver 40, can be supplied to the power supply 50 and the communication interface 60. The electric charge stored in the power supply circuit of the power supply 50 can also be supplied to the power supply 50 or the communication interface 60. The electric charge stored in the power supply circuit of the communication interface 60 can also be supplied to the power supply 50 or the communication interface 60. In other words, the electric charge stored in the terminal apparatus 10 can be supplied to the power supply 50. Therefore, even in a case in which a power outage or voltage drop of the external power source 80 occurs, the controller 20 and the storage 30 can continue to operate on the electric charge stored in the terminal apparatus 10. However, in a case in which the power supply 50 becomes unable to apply the voltage or current required for operation to the controller 20 and the storage 30 due to a decrease in the electric charge stored in the terminal apparatus 10, the controller 20 and the storage 30 become unable to operate.

The controller 20 operates so that writing of data to the storage 30 can be completed in a case in which a power outage or voltage drop of the external power source 80 occurs. Specifically, the controller 20 is configured to detect that a power failure or voltage drop of the external power source 80 has occurred. The controller 20 acquires the measured value of a voltage sensor that measures the voltage applied to the power receiver 40 to detect the occurrence of a power outage and/or a voltage drop of the external power source 80.

In a case in which the controller 20 detects a power outage and/or a voltage drop of the external power source 80, the controller 20 performs control for the supply of power to continue from the power supply 50 to the storage 30 and the controller 20 while controlling the communication interface 60 to stop supplying power to the data output apparatus 70. The controller 20 may also stop the operation of the communication interface 60. The controller 20 may also perform control to stop the supply of power from the power receiver 40 to components other than the controller 20 and the storage 30. By the supply of power to components other than the controller 20 and the storage 30 of the terminal apparatus 10 being stopped, the consumption of electric charge in the terminal apparatus 10 is reduced. The power supply 50 can continue to supply sufficient power to the controller 20 and the storage 30 using the electric charge stored in the terminal apparatus 10.

The electric charge in the terminal apparatus 10 is not consumed by components other than the controller 20 and the storage 30. Rather, consumption is concentrated in the controller 20 and storage 30, thereby lengthening the time during which the power supply 50 can continue to supply sufficient power to the controller 20 and the storage 30. As the time that sufficient power can continue to be supplied to the controller 20 and storage lengthens, the probability that the controller 20 and storage 30 can complete writing data increases. In other words, data is less likely to be lost. The storage is also less likely to fail. Consequently, the reliability of data storage by the terminal apparatus 10 improves. In a case in which the terminal apparatus 10 is a video recorder, it becomes easier to retain the images to be recorded. If the power outage and/or voltage drop of the external power source 80 were to be caused by a person, images of that person would be more likely to remain. Furthermore, if the cause of the power outage and/or voltage drop of the external power source 80 were recorded on camera, images of the cause would be more likely to remain.

In a case in which data is outputted as streaming data from the data output apparatus 70, the storage 30 cannot complete writing of data until learning the end point of the data (until output of the data is finished). Therefore, in a case in which a power outage and/or voltage drop of the external power source 80 is detected, the controller 20 may stop acquiring data from the data output apparatus 70 and determine the end point of the streaming data in order to complete the writing of data. The controller 20 may output a control signal to the data output apparatus 70 to stop outputting data, thereby ending the output of streaming data from the data output apparatus 70. By the end point of the data being determined, the conditions for completing the writing of data become clear. This facilitates the completion of data writing by the controller 20.

The terminal apparatus 10 may automatically resume operation in a case in which the supply of power from the external power source 80 resumes or the voltage applied from the external power source 80 to the power receiver rises. The controller 20 may automatically resume operation based on measurements of the voltage applied to the power receiver 40. The controller may resume acquisition of data from the data output apparatus 70 or may output a control signal to the data output apparatus 70 to resume outputting data.

The controller 20 may be configured to start up automatically in a case in which the power supply from the external power source 80 resumes. The controller 20 may determine that the supply of power from the external power source 80 has resumed based on the controller 20 itself having started up. The controller 20 may determine that the supply of power from the external power source 80 has resumed based on measurements of the voltage applied to the power receiver 40 after the controller 20 itself has started up.

<Flowchart>

Figure 3:
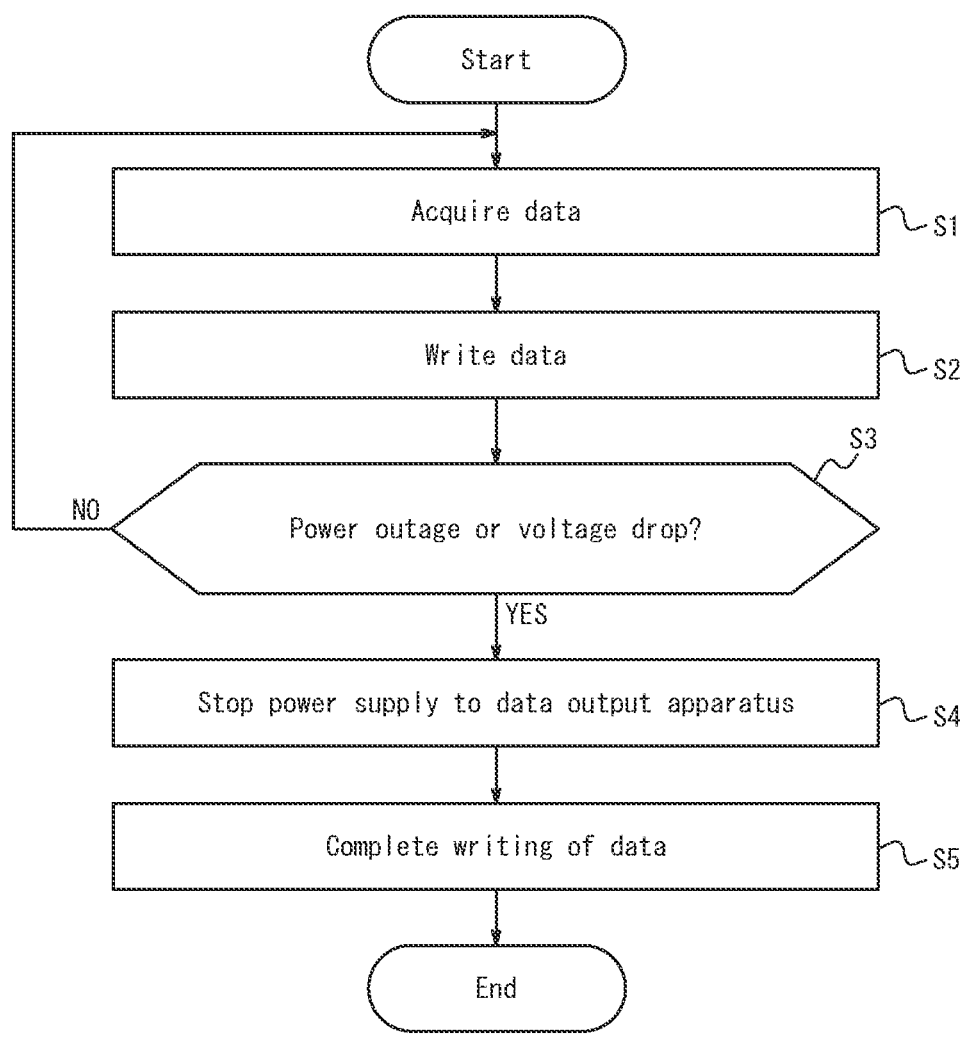
FIG. 3 is a flowchart illustrating example procedures of a method of controlling a terminal apparatus according to one or more embodiments.

The controller 20 of the terminal apparatus 10 may execute a control method including the procedures of the flowchart illustrated in FIG. 3. The control method may be implemented as a control program executed by the processor that configures the controller 20. The control program may be stored on a non-transitory computer readable medium.

The controller 20 acquires data outputted from the data output apparatus 70 (step S1). The controller 20 outputs the data to the storage 30 and controls the storage 30 to write the data (step S2).

Based on the measured value of the voltage applied to the power receiver 40, the controller 20 determines whether a power outage and/or voltage drop of the external power source 80 has occurred (step S3). In a case in which neither a power outage nor a voltage drop of the external power source 80 has occurred (step S3: NO), the controller 20 returns to the procedure of step S1.

In a case in which a power outage and/or voltage drop of the external power source 80 has occurred (step S3: YES), the controller 20 performs control to stop the power supply from the communication interface 60 to the data output apparatus 70 (step S4). The controller 20 completes the writing of data while the controller 20 and the storage 30 are operating on the electric charge in the terminal apparatus 10 (step S5). After executing the procedure of step S5, the controller 20 ends execution of the procedures of the flowchart in FIG. 3.

As described above, according to the terminal apparatus 10 and control method of one or more embodiments, in a case in which a power outage and/or voltage drop of the external power source 80 occurs, writing of data by the controller 20 and the storage 30 is completed without being terminated partway through. Specifically, in a case in which a power outage and/or voltage drop of the external power source 80 occurs, the supply of power to the data output apparatus 70 or to other components such as the communication interface 60 is stopped, so that consumption of the electric charge in the terminal apparatus is concentrated on the controller 20 and the storage 30. In this way, the probability that the controller 20 and the storage 30 can complete the writing of data increases. In other words, data is less likely to be lost. The storage 30 is also less likely to fail. Consequently, the reliability of data storage by the terminal apparatus 10 improves.

OTHER EXAMPLES

The controller 20 may detect signs of the occurrence of a power outage and/or voltage drop of the external power source 80. The controller 20 may, for example, estimate the probability of a power outage and/or voltage drop of the external power source 80 occurring within a predetermined time based on the time change in the measured value of the voltage applied to the power receiver 40. The controller 20 may detect a sign of the occurrence of a power outage and/or voltage drop of the external power source 80 in a case in which the probability of a power outage and/or voltage drop of the external power source 80 occurring within a predetermined time is equal to or greater than a predetermined value. The predetermined value may be set to any of various values, a non-limiting example of which is 50%.

In a case in which a sign of a power outage and/or voltage drop of the external power source 80 is detected, the controller 20 may perform control to stop the power supply from the communication interface 60 to the data output apparatus 70. The controller 20 may also perform control to stop the supply of power to components other than the controller 20 and the storage 30 of the terminal apparatus 10. In this way, the electric charge stored in the terminal apparatus 10 may be increased in a case in which a power outage and/or voltage drop of the external power source 80 has actually occurred. The time during which the power supply 50 can supply sufficient power to the controller 20 and the storage 30 lengthens.

In a case in which the external power source 80 includes a battery, the controller 20 may acquire information on the charge rate of the battery. The controller 20 may detect a sign of the occurrence of a power outage and/or voltage drop of the external power source 80 in a case in which the charge rate of the battery falls to a predetermined value or less. The controller 20 may detect a sign of the occurrence of a power outage and/or voltage drop of the external power source 80 in a case in which the charge rate of the battery is determined to be approaching zero.

The controller 20 may include a backup power supply that supplies power to the controller 20 itself so that the controller 20 can continue to control each component of the terminal apparatus 10, even in a case in which a power outage and/or voltage drop of the external power source 80 has occurred.

Although embodiments of the present disclosure have been described through drawings and examples, it is to be noted that various changes and modifications may be made by those skilled in the art on the basis of the present disclosure. Therefore, such changes and modifications are to be understood as included within the scope of the present disclosure. For example, the functions or the like included in the various components or steps may be reordered in any logically consistent way. Furthermore, components or steps may be combined into one or divided.

What is claimed is:

1. A terminal apparatus comprising:
   a communication interface that acquires data output from a data output apparatus and supplies power to the data output apparatus;
   a storage that writes the data to a medium;
   a controller that controls the storage;
   a power supply that supplies power to the storage; and
   a power receiver that receives power from an external power source and supplies power to the communication interface and the power supply, wherein
   in response to detecting a power outage and/or a voltage drop of the external power source, the power receiver supplies, to the power supply, electric charge stored in the terminal apparatus but does not supply, to the communication interface, the electric charge stored in the terminal apparatus.

2. The terminal apparatus according to claim 1, wherein in response to detecting the power outage and/or the voltage drop, the controller determines an end point of the data output from the data output apparatus as streaming data.

3. The terminal apparatus according to claim 2, wherein the controller determines the end point of the data by stopping acquisition of the data.

4. The terminal apparatus according to claim 2, wherein the controller determines the end point of the data by controlling the data output apparatus to stop outputting the data.

5. The terminal apparatus according to claim 3, wherein the controller determines the end point of the data by controlling the data output apparatus to stop outputting the data.

\* \* \* \* \*